United States Patent
Fan et al.

(10) Patent No.: US 9,123,558 B2
(45) Date of Patent: Sep. 1, 2015

(54) BIPOLAR JUNCTION TRANSISTOR

(75) Inventors: Sheng-Hung Fan, Hsinchu (TW);
Chu-Wei Hu, Hsinchu County (TW);
Chien-Chih Lin, Hsinchu (TW);
Chih-Chung Chiu, Miaoli County
(TW); Zheng Zeng, Fremont, CA (US);
Wei-Li Tsao, Hsinchu County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 1063 days.

(21) Appl. No.: 13/164,744

(22) Filed: Jun. 20, 2011

(65) Prior Publication Data

US 2012/0319243 A1 Dec. 20, 2012

(51) Int. Cl.
*H01L 29/73* (2006.01)
*H01L 29/06* (2006.01)
*H01L 29/40* (2006.01)
*H01L 29/732* (2006.01)

(52) U.S. Cl.
CPC .......... *H01L 29/0692* (2013.01); *H01L 29/402* (2013.01); *H01L 29/732* (2013.01); *H01L 29/0649* (2013.01)

(58) Field of Classification Search
CPC ...................................................... H01L 29/73
USPC .......................................... 257/588, E29.174
See application file for complete search history.

(56) References Cited

U.S. PATENT DOCUMENTS

| | | | |
|---|---|---|---|
| 5,389,553 A | 2/1995 | Grubisich | |
| 5,903,034 A | 5/1999 | Sakamoto | |
| 6,350,661 B2 | 2/2002 | Lim | |
| 6,437,408 B1 | 8/2002 | Shih | |
| 6,906,363 B2 | 6/2005 | Suzuki | |
| 7,223,698 B1 | 5/2007 | Bonser | |
| 7,554,174 B2 | 6/2009 | Seo | |
| 2008/0169484 A1 | 7/2008 | Chuang | |
| 2010/0164012 A1* | 7/2010 | Yoon | 257/370 |
| 2010/0291463 A1 | 11/2010 | Ji | |
| 2010/0317165 A1 | 12/2010 | Kim | |
| 2011/0220963 A1* | 9/2011 | Chuang et al. | 257/140 |

FOREIGN PATENT DOCUMENTS

| | | |
|---|---|---|
| CN | 1362734 A | 8/2002 |
| CN | 101887977 A | 11/2010 |
| TW | 200627640 | 8/2006 |
| TW | 200709258 | 3/2007 |
| WO | 2006098868 A2 | 9/2006 |

* cited by examiner

*Primary Examiner* — Marc Armand
(74) *Attorney, Agent, or Firm* — Winston Hsu; Scott Margo

(57) ABSTRACT

In accordance with one embodiment, the present invention provides a bipolar junction transistor including an emitter region; a base region; a first isolation between the emitter region and the base region; a gate on the first isolation region and overlapping at least a portion of a periphery of the emitter region; a collector region; and a second isolation between the base region and the collector region.

20 Claims, 3 Drawing Sheets

BIPOLAR JUNCTION TRANSISTOR

BACKGROUND OF THE INVENTION

1. Field of the Invention

This invention relates generally to semiconductor devices, and more particularly to bipolar junction transistors.

2. Description of the Prior Art

As known in the art, bipolar junction transistors (BJTs), which can be formed using a CMOS compatible process, are key parts of analog integrated circuits such as band-gap voltage reference circuits. These circuits are often sensitive to Vbe (base-emitter voltage) value and Vbe mismatch of BJT.

Unfortunately, the prior art CMOS process compatible BJT structure is not able to control Vbe value and the Vbe mismatch characteristic is unsatisfactory due to salicide non-uniformity that typically occurs at the edge of the active region. The salicide is formed in the active region to reduce the contact resistance. It has been found that salicide encroachment at the edge of the active region causes $P^+/N$ well junction leakage, thus leading to worse Vbe mismatch performance. One approach to improve salicide non-uniformity is to reduce cobalt thickness during the salicide formation. However, this approach adversely affects resistance for non-salicide resistors.

Therefore, there is a need in the industry to provide an improved structure of bipolar junction transistors, which is able to control Vbe value of the BJT and provide reduced Vbe mismatch.

SUMMARY OF THE INVENTION

It is one objective of the invention to provide an improved structure of bipolar junction transistors, which is able to control Vbe value of the BJT and provide reduced Vbe mismatch.

From one aspect, in accordance with one embodiment, the present invention provides a bipolar junction transistor including an emitter region; a base region; a first isolation between the emitter region and the base region; a gate on the first isolation region and overlapping at least a portion of a periphery of the emitter region; a collector region; and a second isolation between the base region and the collector region.

From another aspect, in accordance with another embodiment, the present invention provides a bipolar junction transistor including an emitter region; a base region; a first isolation between the emitter region and the base region; a gate on the first isolation region, wherein a sidewall spacer of the gate fills into a recess between the first isolation and the emitter region; a collector region; and a second isolation between the base region and the collector region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
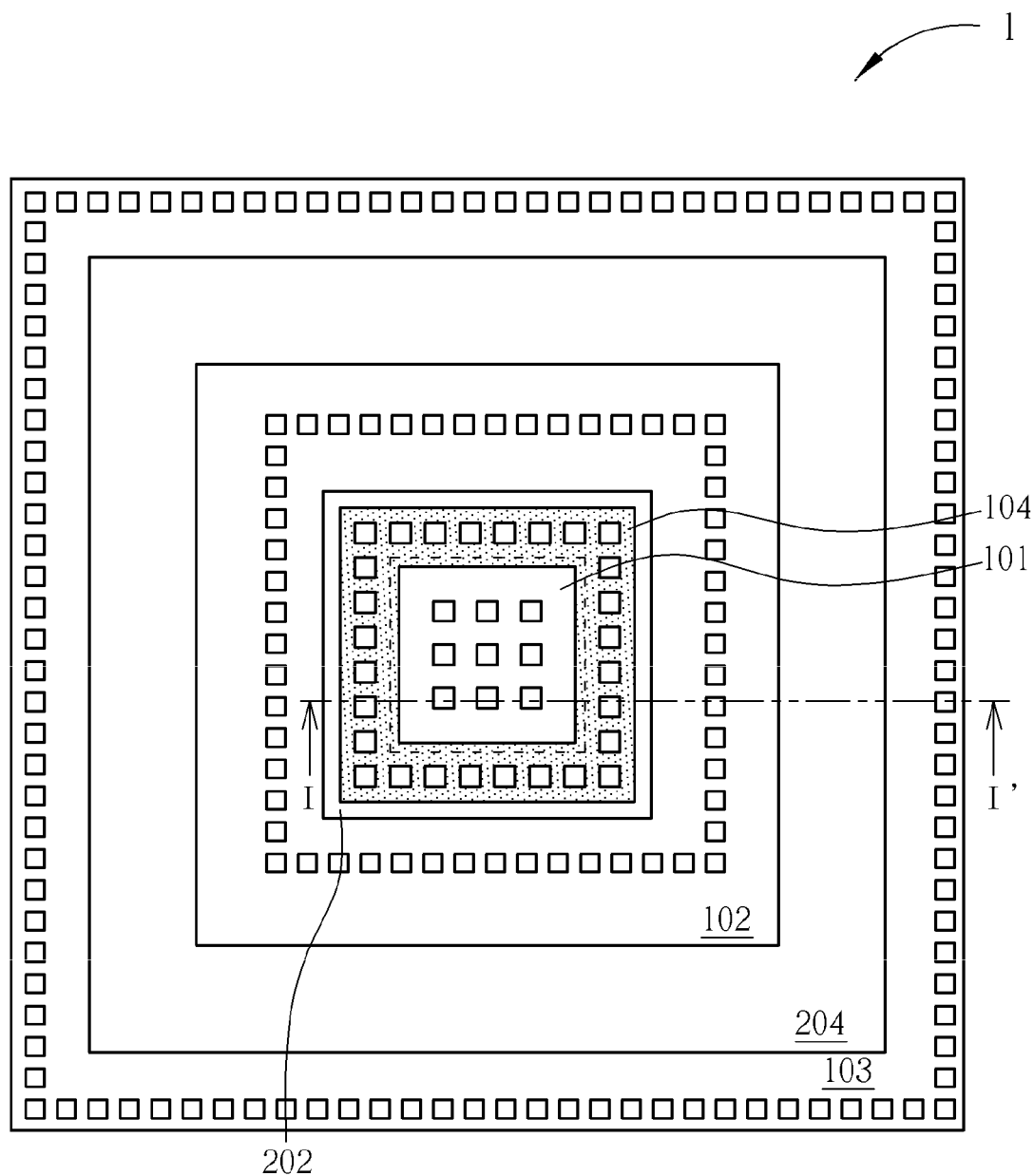
FIG. 1 is an exemplary layout diagram of a substantially concentric PNP bipolar junction transistor according to one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The structure and layout of the present invention bipolar junction transistor (BJT) are described in detail. The improved BJT structure is described for a lateral PNP bipolar junction transistor, but it should be understood by those skilled in the art that by changing the polarity of the conductive dopants lateral NPN bipolar junction transistors can be made.

Figure 2:
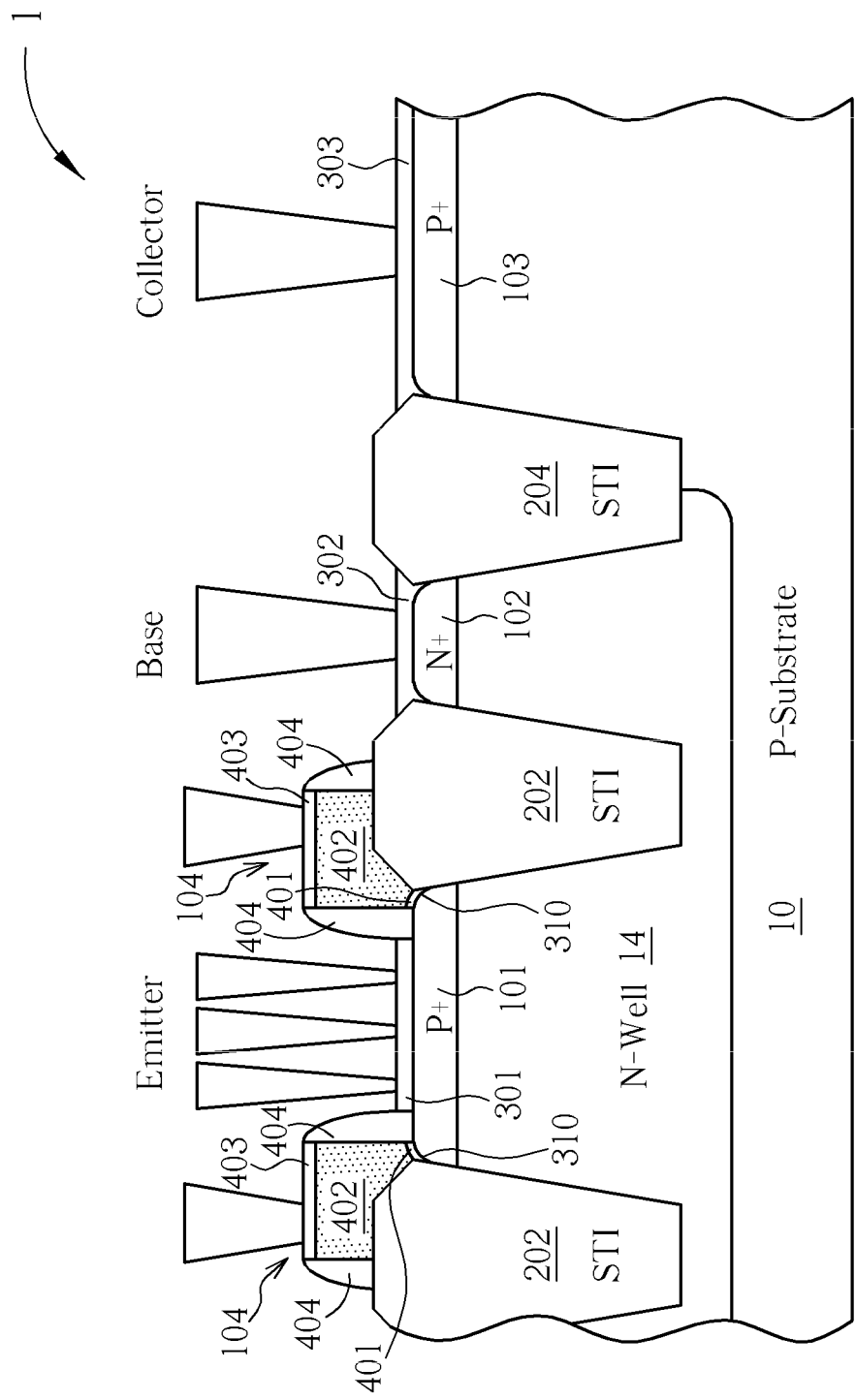
FIG. 2 is a schematic, cross-sectional view of the PNP bipolar junction transistor in FIG. 1, taken along line I-I' of FIG. 1.

Please refer to FIG. 1 and FIG. 2. FIG. 1 is an exemplary layout diagram of a substantially concentric PNP bipolar junction transistor 1 according to one embodiment of the invention. FIG. 2 is a schematic, cross-sectional view of the PNP bipolar junction transistor in FIG. 1, taken along line I-I' of FIG. 1. As shown in FIG. 1 and FIG. 2, the PNP bipolar junction transistor 1 can be formed in a semiconductor substrate 10 such as a P type doped silicon substrate. The PNP bipolar transistor 1 comprises a $P^+$ doping region 101 that functions as an emitter region of the PNP bipolar transistor 1, which can be formed within an N well 14. The rectangular shape of the emitter region 101 as set forth in FIG. 1 is merely exemplary. The contour of the emitter region 101 is indicated by dashed line.

An $N^+$ doping region such as an annular $N^+$ doping region 102 that functions as a base region of the PNP bipolar junction transistor 1 can be disposed about at least a portion of a periphery of the emitter region 101. The rectangular shape of the $N^+$ doping region 102 as set forth in FIG. 1 is merely exemplary. An isolation region, such as an annular shallow trench isolation (STI) region 202 can be disposed between the emitter region 101 and the base region 102. According to the embodiment of this invention, the emitter region 101, the base region 102 and the isolation region 202 can be formed within the N well 14.

A $P^+$ doping region such as an annular $P^+$ doping region 103 that functions as a collector region of the PNP bipolar junction transistor 1 can be disposed about at least a portion of a periphery of the base region 102. Likewise, the rectangular shape of the $P^+$ doping region 103 as set forth in FIG. 1 is merely exemplary. An isolation region such as an annular STI region 204 can be disposed between the collector region 103 and the base region 102. The isolation region 202 can be spaced apart and physically separated from the isolation region 204.

A gate such as a continuous, annular polysilicon gate 104 can be provided on the isolation region 202 and overlaps with at least a portion of a periphery the emitter region 101. The gate 104 may surround the emitter region 101. According to the embodiment of this invention, the gate 104 may function as a Vbe (base-emitter voltage) control gate. According to the embodiment of this invention, a voltage can be applied on the gate 104 to change the characteristics of the PNP bipolar transistor 1. For example, a negative gate voltage can be applied to the gate 104 to lower the Vbe of the PNP bipolar transistor 1 and thus lower the breakdown voltage of the PNP bipolar transistor 1. That is at least because a negative gate voltage applied to the gate 104 can help accumulate hole at the edge between the isolation region 202 and the emitter region 101 and thus result in a more abrupt junction. For an NPN bipolar transistor, a positive gate voltage can be applied to the gate to lower the breakdown voltage. However, according to another embodiment of this invention, the gate 104 may be electrically floating and/or no gate voltage is applied to the gate 104. According to the embodiment of this invention, the gate 104 may be a P+ doped polysilicon gate. For an NPN BJT, the gate may be an N+ doped polysilicon gate.

To reduce contact resistance, an emitter salicide layer 301 such as cobalt salicide or the like can be formed on at least a portion of the emitter region 101 that is not covered by the gate 104. In this embodiment, the emitter salicide layer 301 is not formed in the recess 310 between the isolation 202 and the emitter region 101, for example, between the inner edge of the isolation region 202 and the emitter region 101. Since the recess 310 is blocked with the gate 104 during the salicide formation process, the salicide encroachment at the edge of the active region can be alleviated for the emitter region 101. The P+ region 101/N-well 14 junction leakage can be reduced by alleviating the salicide encroachment, and thereby a PNP bipolar junction transistor 1 with reduced Vbe mismatch is provided. According to the embodiment of this invention, a base salicide layer 302 such as cobalt salicide or the like can be formed on at least a portion of the base region 102. According to the embodiment of this invention, a collector salicide layer 303 such as cobalt salicide or the like can be formed on at least a portion of the collector region 103.

According to the embodiment of this invention, a gate dielectric layer 401 such as silicon dioxide can be formed in the recess 310 between a polysilicon layer 402 of the gate 104 and the emitter region 101. The gate 104 may further comprise a salicide layer 403 on the polysilicon layer 402 and at least one sidewall spacer 404.

Figure 3:
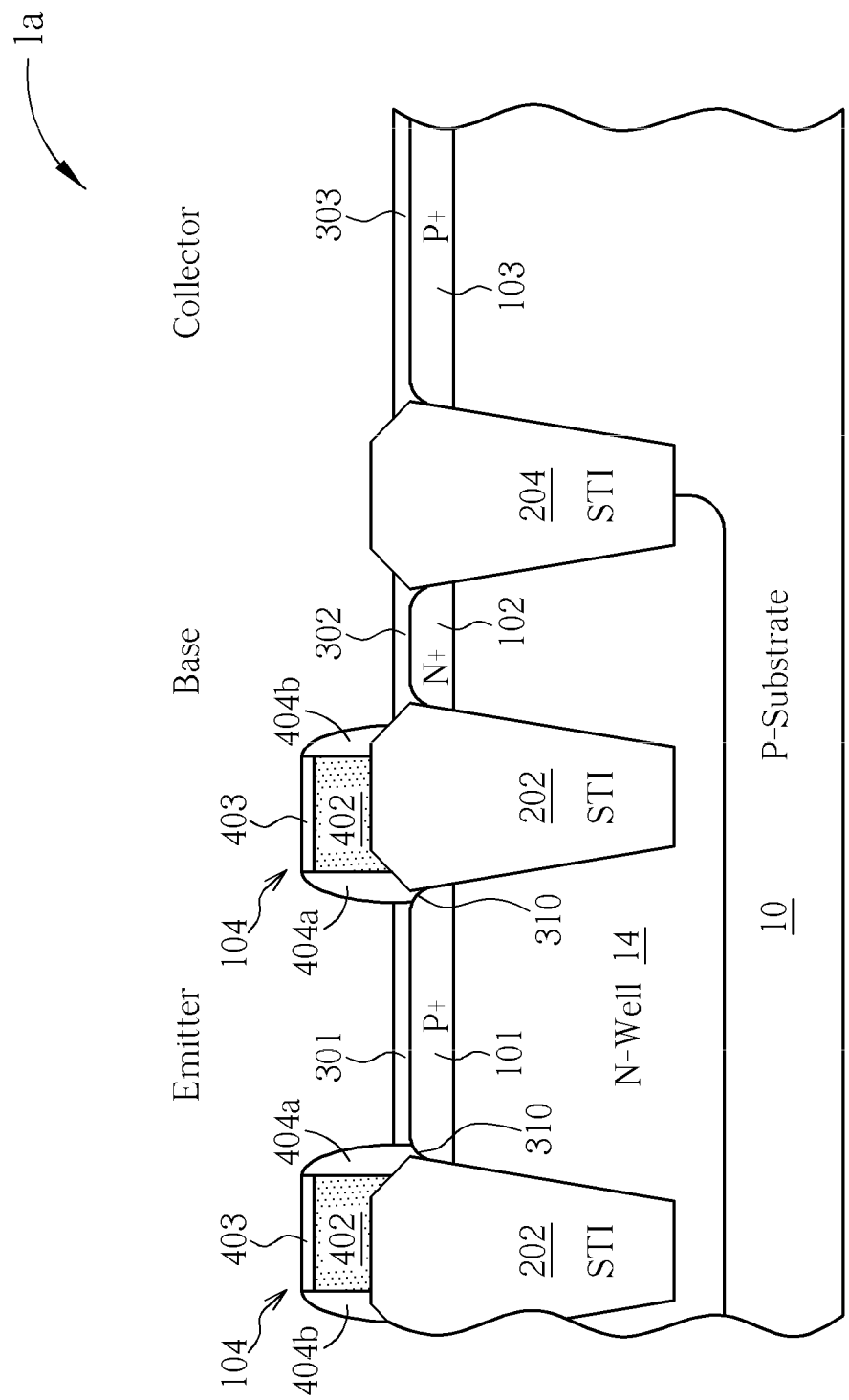
FIG. 3 is a schematic, cross-sectional view of a PNP bipolar junction transistor in accordance with another embodiment of this invention.

FIG. 3 is a schematic, cross-sectional view of a PNP bipolar junction transistor 1a in accordance with another embodiment of this invention, wherein like numeral numbers designate like regions, layers or elements. As shown in FIG. 3, likewise, the PNP bipolar junction transistor 1a can be formed in a semiconductor substrate 10 such as a P type doped silicon substrate. The PNP bipolar transistor 1a comprises a P+ doping region 101 that functions as an emitter region of the PNP bipolar transistor 1a, which can be formed within an N well 14.

An N+ doping region such as an annular N+ doping region 102 that functions as a base region of the PNP bipolar junction transistor 1a can be disposed about at least a portion of a periphery of the emitter region 101. An isolation region such as a STI region 202 can be disposed between the emitter region 101 and the base region 102. According to the embodiment of this invention, the emitter region 101, the base region 102 and the isolation region 202 can be formed within the N well 14. A P+ doping region such as an annular P+ doping region 103 that functions as a collector region of the PNP bipolar junction transistor 1a can be disposed about at least a portion of a periphery of the base region 102. An isolation region such as an annular STI region 204 can be disposed between the collector region 103 and the base region 102. The isolation region 202 can be spaced apart and physically separated from the isolation region 204.

A gate such as a continuous, annular polysilicon gate 104 can be provided on the isolation region 202. In this embodiment, a sidewall spacer 404a of the gate 104 fills into a recess 310 between the isolation region 202 and the emitter region 101. The gate 104 may surround the emitter region 101. According to the embodiment of this invention, the gate 104 may function as a Vbe control gate. According to the embodiment of this invention, a voltage can be applied on the gate 104 to change the characteristics of the PNP bipolar transistor 1a. For example, a negative gate voltage can be applied to the gate 104 to lower the Vbe of the PNP bipolar transistor 1a and thus lower the breakdown voltage of the PNP bipolar transistor 1a. That is at least because a negative gate voltage applied to the gate 104 can help accumulate hole at the edge between the isolation region 202 and the emitter region 101 and thus result in a more abrupt junction. For an NPN bipolar transistor, a positive gate voltage can be applied to the gate to lower the breakdown voltage. However, according to another embodiment of this invention, the gate 104 may be electrically floating and/or no voltage is applied to the gate 104. According to the embodiment of this invention, the gate 104 may be a P+ doped polysilicon gate. For an NPN BJT, the gate may be an N+ doped polysilicon gate.

To reduce contact resistance, an emitter salicide layer 301 such as cobalt salicide or the like can be formed on at least a portion of the emitter region 101 that is not covered by the gate 104. In this embodiment, the emitter salicide layer 301 is not formed in the recess 310 between the isolation region 202 and the emitter region 101, for example, between the inner edge of the isolation region 202 and the emitter region 101. Since the recess 310 is blocked with the gate 104 during the salicide formation process, the salicide encroachment at the edge of the active region can be alleviated for the emitter region 101. The P+ region 101/N-well 14 junction leakage can be reduced by alleviating the salicide encroachment, and thereby a PNP bipolar junction transistor 1a with reduced Vbe mismatch is provided. According to the embodiment of this invention, a base salicide layer 302 such as cobalt salicide or the like can be formed on the at least a portion of base region 102. According to the embodiment of this invention, a collector salicide layer 303 such as cobalt salicide or the like can be formed on at least a portion of the collector region 103.

According to the embodiment of this invention, the recess 310 between the isolation region 202 and the emitter region 101 is filled with the spacer 404a on the inner sidewall of the gate 104. The polysilicon layer 402 of the gate 104 can be formed on the isolation 202 and the polysilicon layer 402 may not overlap with the emitter region 101. In this case, there may not be gate dielectric layer formed in the recess 310.

The BJT provided in the embodiments can be CMOS process compatible parasitic bipolar junction transistors, and is capable of controlling Vbe value of the BJT and/or providing reduced Vbe mismatch.

Those skilled in the art will readily observe that numerous modifications and alterations of the device and method may be made while retaining the teachings of the invention.

What is claimed is:

1. A bipolar junction transistor, comprising:
   an emitter region;
   a base region;
   a first isolation between the emitter region and the base region;
   a gate on the first isolation region and overlapping at least a portion of a periphery of the emitter region;
   a collector region;
   a second isolation between the base region and the collector region; and a gate dielectric layer formed in a recess between the first isolation and the emitter region.

2. The bipolar junction transistor according to claim 1, wherein the bipolar junction transistor further comprises an emitter salicide layer on the emitter region.

3. The bipolar junction transistor according to claim 1, wherein the gate comprises a polysilicon layer and at least one sidewall spacer.

4. The bipolar junction transistor according to claim 1, wherein the gate surrounds the emitter region.

5. The bipolar junction transistor according to claim 4, wherein the gate dielectric layer is formed between the polysilicon layer and the emitter region.

6. The bipolar junction transistor according to claim 1, wherein the bipolar junction transistor further comprises a base salicide layer on the base region and a collector salicide layer on the collector region.

7. The bipolar junction transistor according to claim 1, wherein a gate voltage is applied to the gate in order to control Vbe (base-emitter voltage) of the bipolar junction transistor.

8. The bipolar junction transistor according to claim 1, wherein the gate is electrically floating.

9. The bipolar junction transistor according to claim 2, wherein the emitter salicide layer is not formed in the recess.

10. The bipolar junction transistor according to claim 3, wherein the gate dielectric layer formed between the polysilicon layer and the emitter region.

11. A bipolar junction transistor, comprising:
an emitter region;
a base region;
a first isolation between the emitter region and the base region;
a gate on the first isolation region, wherein a recess between the first isolation and the emitter region is completely filled with a sidewall spacer of the gate;
a collector region; and
a second isolation between the base region and the collector region.

12. The bipolar junction transistor according to claim 11, wherein the bipolar junction transistor further comprises an emitter salicide layer on the emitter region.

13. The bipolar junction transistor according to claim 11, wherein the gate further comprises a polysilicon layer.

14. The bipolar junction transistor according to claim 11, wherein the gate surrounds the emitter region.

15. The bipolar junction transistor according to claim 11, wherein a gate voltage is applied to the gate in order to control Vbe (base-emitter voltage) of the bipolar junction transistor.

16. The bipolar junction transistor according to claim 11, wherein the gate is electrically floating.

17. The bipolar junction transistor according to claim 11, wherein the gate is $P^+$ doped polysilicon gate.

18. The bipolar junction transistor according to claim 11, wherein the bipolar junction transistor further comprises a base salicide layer on the base region and a collector salicide layer on the collector region.

19. The bipolar junction transistor according to claim 12, wherein the emitter salicide layer is not formed in the recess, and wherein the emitter salicide layer is in contact with the sidewall spacer.

20. The bipolar junction transistor according to claim 15, wherein the gate voltage is a negative voltage.

* * * * *